United States Patent
Kumar et al.

(10) Patent No.: US 9,633,959 B2
(45) Date of Patent: Apr. 25, 2017

(54) INTEGRATED CIRCUIT DIE WITH CORNER IO PADS

(71) Applicants: Shailesh Kumar, Ghaziabad (IN); Vikas Garg, Delhi (IN); Meng Kong Lye, Shah Alam (MY)

(72) Inventors: Shailesh Kumar, Ghaziabad (IN); Vikas Garg, Delhi (IN); Meng Kong Lye, Shah Alam (MY)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 38 days.

(21) Appl. No.: 14/620,155

(22) Filed: Feb. 11, 2015

(65) Prior Publication Data

US 2016/0233183 A1   Aug. 11, 2016

(51) Int. Cl.
| | |
|---|---|
| *H01L 23/48* | (2006.01) |
| *H01L 23/52* | (2006.01) |
| *H01L 23/00* | (2006.01) |
| H01L 23/31 | (2006.01) |

(52) U.S. Cl.
CPC .............. *H01L 24/06* (2013.01); *H01L 24/02* (2013.01); *H01L 23/3171* (2013.01); *H01L 24/05* (2013.01); *H01L 2224/0235* (2013.01); *H01L 2224/02375* (2013.01); *H01L 2224/04042* (2013.01); *H01L 2224/05553* (2013.01); *H01L 2224/05554* (2013.01); *H01L 2224/05567* (2013.01); *H01L 2224/0603* (2013.01); *H01L 2224/06051* (2013.01); *H01L 2224/06131* (2013.01); *H01L 2224/06135* (2013.01); *H01L 2224/06138* (2013.01); *H01L 2224/06139* (2013.01); *H01L 2224/06179* (2013.01)

(58) Field of Classification Search
CPC   H01L 23/528; H01L 27/0207; H01L 23/5286
See application file for complete search history.

(56) References Cited

U.S. PATENT DOCUMENTS

| | | | |
|---|---|---|---|
| 6,013,924 A | * | 1/2000 | Osajima ................ H01L 27/118 257/203 |
| 6,489,688 B1 | | 12/2002 | Baumann |
| 6,713,881 B2 | | 3/2004 | Umehara et al. |
| 6,812,580 B1 | | 11/2004 | Wenzel et al. |
| 7,042,098 B2 | | 5/2006 | Harun et al. |
| 8,227,917 B2 | | 7/2012 | Hsu et al. |
| 8,242,613 B2 | | 8/2012 | Verma et al. |
| 2007/0108567 A1 | * | 5/2007 | Alabin ................ H01L 23/3107 257/676 |
| 2010/0155957 A1 | | 6/2010 | Han |
| 2012/0299167 A1 | * | 11/2012 | Chen ................ H01L 23/3114 257/668 |

* cited by examiner

*Primary Examiner* — Calvin Choi
*Assistant Examiner* — Xiaoming Liu
(74) *Attorney, Agent, or Firm* — Charles E. Bergere

(57) ABSTRACT

An integrated circuit (IC) die has side input/output (IO) pads located along each side of the die interior. Each die corner has a corner IO pad. The side IO pads adjacent to the corner IO pads have shortened passivation regions in the top metal layer (TML) that define TML access regions. TML traces run through the TML access regions to connect the corner IO pads to the die interior. Providing corner IO pads enables an IC die to have up to four more IO pads than a comparable conventional IC die that does not have any corner IO pads, or an IC die to have the same number of IO pads within a smaller overall footprint.

11 Claims, 3 Drawing Sheets

INTEGRATED CIRCUIT DIE WITH CORNER IO PADS

BACKGROUND

The present invention relates to integrated circuits (ICs) and, more particularly, to input/output (IO) pads for IC dies.

FIG. 1 is a simplified top plan view of a conventional IC die 100 having (e.g., nine) side input/output (IO) pads 110 on each side of the die interior 120. The four areas 130 corresponding to the four corners of the IC die 100 do not have any IO pads.

FIG. 2 is a simplified top plan view of the lower right corner of the IC die 100 of FIG. 1. In FIG. 2, label 112 represents the passivation region in the top metal layer (TML) of the IC die 100 corresponding to the side IO pads 110, while label 114 represents the center of the bond area within the passivation region 112 that would receive a bond wire (not shown). Each dashed box in FIG. 2 represents the footprint of the corresponding side IO pad 110 taking into account all of the layers within the IC die 100 corresponding to the side IO pad 110.

In a conventional side IO pad, like the side IO pads 110, the electrical signal (e.g., data or power) flows (i) vertically between the TML passivation region 112 and one or more non-TML pad regions (not shown) in metal layers below the top metal layer and (ii) horizontally between the non-TML pad regions and the die interior 120. As indicated in FIG. 2, the footprints of the two side IO pads 110 that are adjacent to the die corner 130 almost touch each other at their pad corners 116 such that electrical signals cannot be routed between the die interior 120 and the die corner 130. That is why conventional IC dies, like the IC die 100, do not have IO pads in their corner regions 130. However, it would be advantageous to be able to use these corner spaces for IO pads.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In one embodiment, the present invention is an integrated circuit (IC) die comprising: a die interior having four sides; a first set of side input/output (IO) pads located along a first side of the die interior; a second set of side IO pads located along a second side of the die interior adjacent to the first side at a first die corner of the IC die, wherein the first die corner has lateral dimensions; a first corner IO pad located within the first die corner, wherein a first adjacent side IO pad in the first set of side IO pads is adjacent to the first corner IO pad and has a first pad region that is shorter than the corresponding lateral dimension of the first die corner, thereby defining a first access region; and a first trace running through the first access region to connect the first corner IO pad to the die interior.

Figure 2:
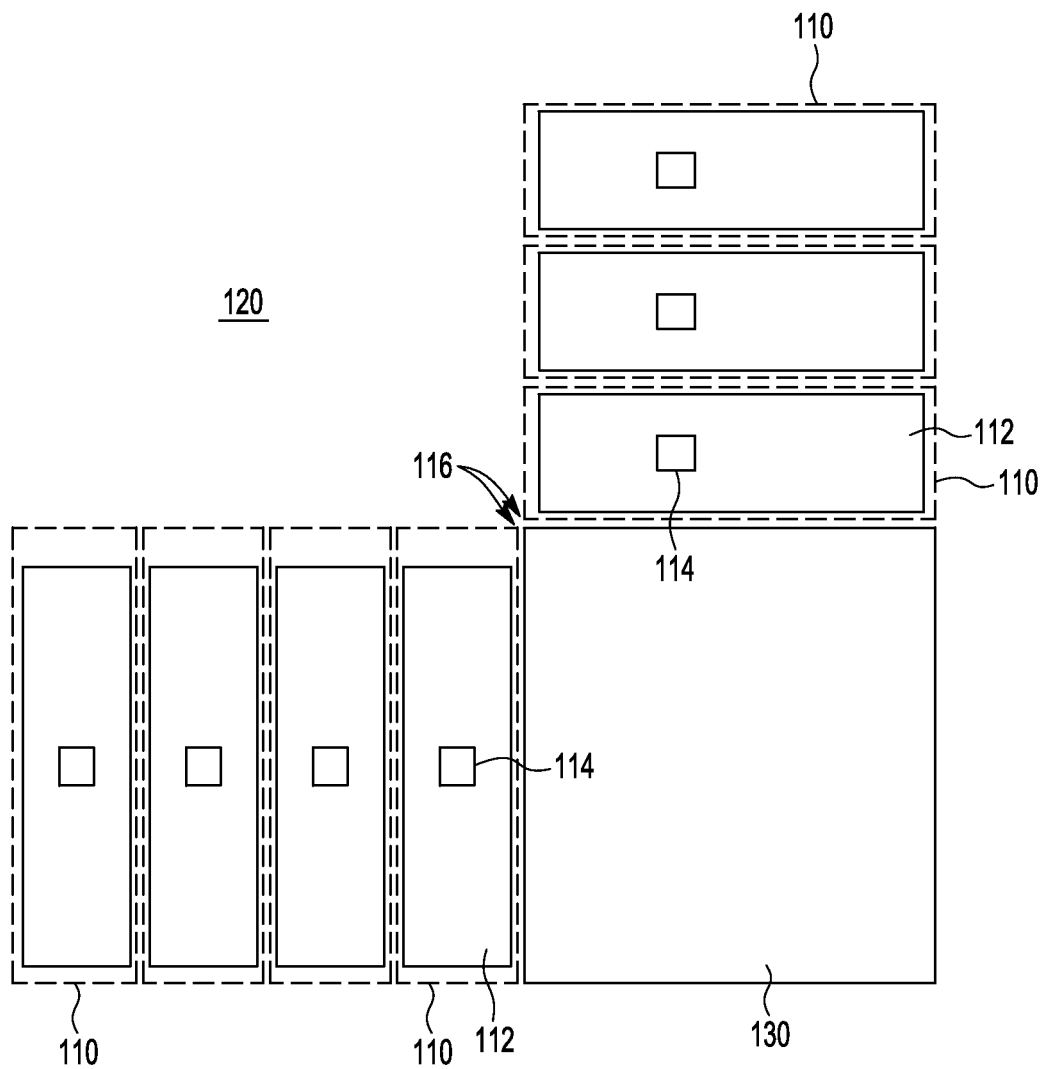
FIG. 2 is a simplified top plan view of the lower right corner of the IC die of FIG. 1.
Figure 3:
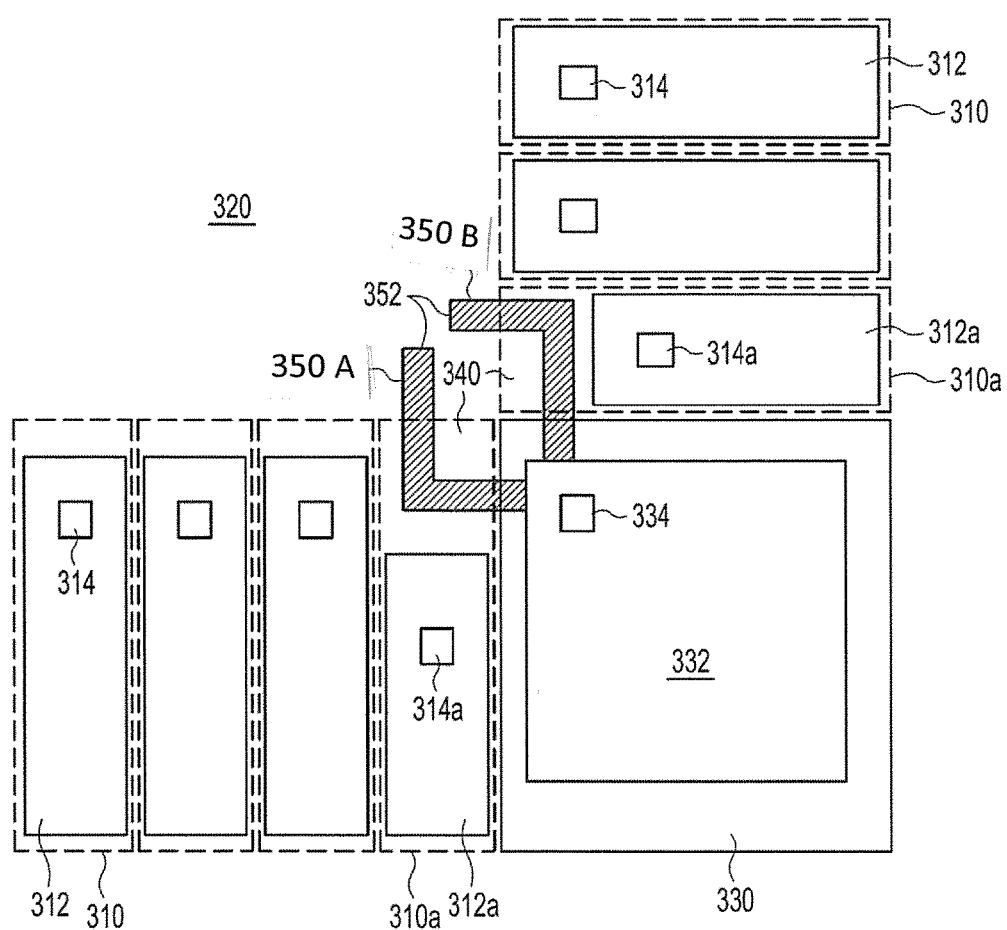
FIG. 3 is a simplified top plan view of one corner of an IC die according to one embodiment of the invention.

Referring now to FIG. 3, a simplified top plan view of one corner 330 of an IC die 300 according to one embodiment of the present invention is shown. The other corners of the IC die 300 may be analogous to the corner shown in FIG. 3. As with the IC die 100 of FIGS. 1 and 2, the IC die 300 has a number of side IO pads 310, 310a on each side of the die interior 320, where each side IO pad 310, 310a has a passivation region 312, 312a having a bond-area center 314, 314a.

The passivation regions 312a for the two side IO pads 310a that are adjacent to the die corner 330 are shorter than the passivation regions 312 for the other side IO pads 310. These two shorter passivation regions 312a define access regions 340 in the top metal layer of the IC die 300 that enable two traces 350A and 350B (referred to collectively as traces 350) to be formed in the top metal layer to route electrical signals between the die interior 320 and the die corner 330, which in turn enables a corner IO pad 332 (having the bond-area center 334) to be implemented within the die corner 330 of the IC die 300. Although not shown in FIG. 3, the electrical signals routed horizontally by the TML traces 350 between the corner IO pad 332 and the die interior 320 can also be routed vertically between the interior ends 352 of the TML traces 350 and lower metal layers of the IC die 300.

Figure 1:
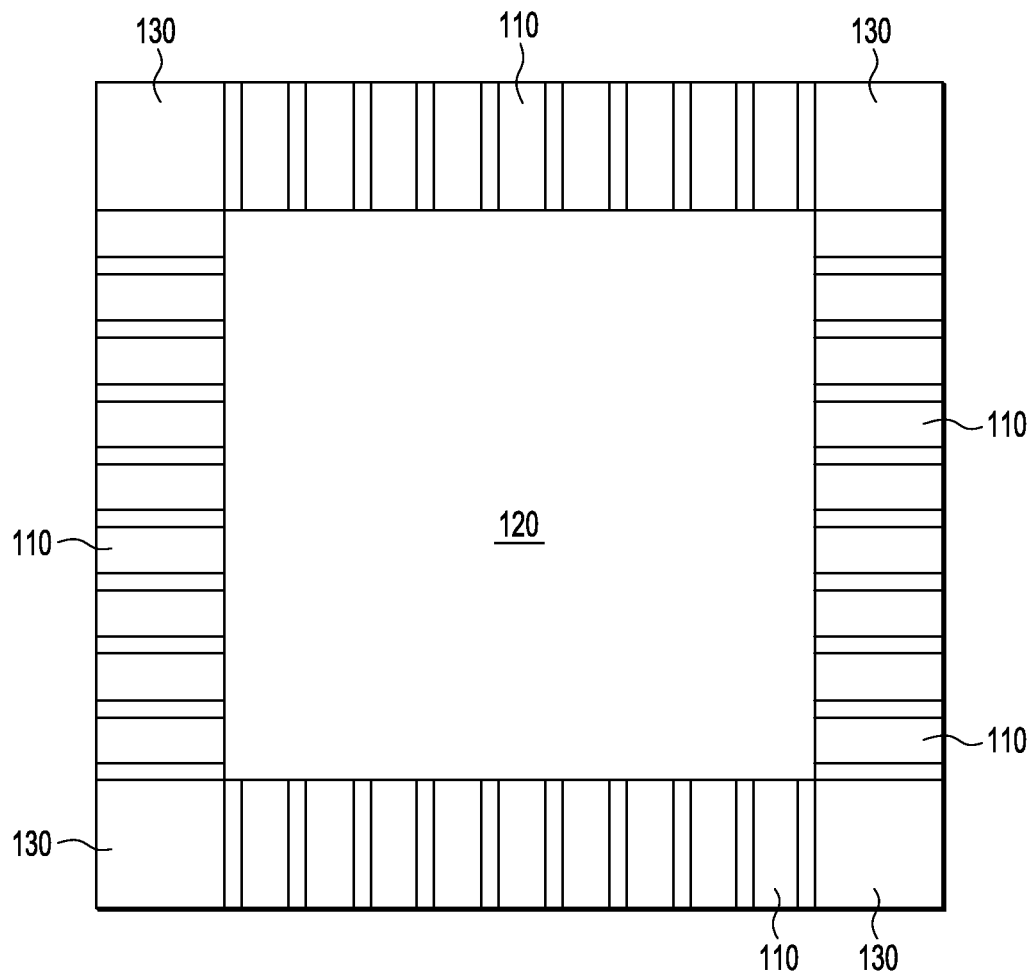
FIG. 1 is a simplified top plan view of a conventional IC die.

By providing corner IO pads, like the corner IO pad 332, the IC die 300 can be fabricated with up to four additional IO pads compared to the conventional IC die 100 of FIGS. 1 and 2. Alternatively, the same number of IO pads can be provided with an IC die that has a smaller overall footprint than the conventional IC die 100. The IC die 300 may be assembled with other components, such as a lead frame and bond wires, to form a packaged semiconductor device.

Although the invention has been described in the context of the IC die 300 of FIG. 3, the invention is not limited to that embodiment. For example, although the IC die 300 has two traces 350 running between the corner IO pad 332 and the die interior 320, in general, IC dies of the invention can have one or more such traces. Similarly, although the IC die 300 has two shortened passivation regions 312a corresponding to the two adjacent side IO pads 310a, in other embodiments, only one passivation region is shortened to provide a single access region for one or more traces.

Furthermore, although the passivation regions 312*a* of the two adjacent side IO pads 310*a* are shorter than the passivation regions 312 of the other side IO pads 310 in the IC die 300, in other embodiments, one or more or all of the passivation regions of the other (i.e., non-adjacent) side IO pads may also be shortened. The key is not that the passivation regions of the adjacent side IO pads are shorter than the passivation regions of the other side IO pads. Rather, the key is that the passivation region(s) of one or both adjacent side IO pads are shorter than the corresponding lateral dimension of the die corner in order to provide one or two access regions for routing traces between the die interior and the corresponding corner IO pad.

Although the traces 350 between the die interior 320 and the corner IO pad 332 in the IC die 100 lie in the top metal layer, in other embodiments, one or more corresponding traces lie in lower metal layers. In those embodiments, the electrical signal is routed vertically between the TML passivation region of the corner IO pad and one or more lower metal layers of the IC die and then routed horizontally to the IC interior along the one or more lower-metal-layer (i.e., non-TML) traces. In those embodiments, the corresponding lower-metal-layer pad regions of one or both of the adjacent side IO pads would be shortened to provide one or more non-TML access regions for the one or more non-TML traces.

Although the invention has been described in the context of IC dies having side IO pads on all four sides of the die interior, in general, the invention applies to IC dies having side IO pads on at least two adjacent sides and one or more corresponding corner IO pads.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Unless explicitly stated otherwise, each numerical value and range should be interpreted as being approximate as if the word "about" or "approximately" preceded the value or range.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

The invention claimed is:

1. An integrated circuit (IC) die comprising:
   a die interior having four sides;
   a first set of side input/output (IO) pads located along a first side of the die interior;
   a second set of side pads located along a second side of the die interior adjacent to the first side at a first die corner of the IC die, wherein the first die corner has lateral dimensions;
   a first corner IO pad located within the first die corner, wherein a first adjacent side IO pad in the first set of side IO pads is adjacent to the first corner IO pad and had a first pad region that is shorter than the corresponding lateral dimension of the first die corner, thereby defining a first access region; and
   a first trace running through the first access region to connect the first corner IO pad to the die interior, wherein the first trace has a first leg that projects perpendicular from the first corner IO pad into the first access region, and a second leg perpendicular to the first leg that extends into the die interior.

2. The IC die of claim 1, wherein;
   the first pad region, the first access region, and the first trace are in a top metal layer (TML) of the IC die; and
   the first pad region is a TML passivation region of the first adjacent side IO pad.

3. The IC die of claim 1, wherein:
   a second adjacent side IO pad in the second set of side IO pads is adjacent to the first corner IO pad and has a second pad region that is shorter than the corresponding lateral dimension of the first die corner, thereby defining a second access region; and
   further comprising a second trace running through the second access region to connect the first corner IO pad to the die interior, wherein the second trace has a first leg that projects perpendicular from the first corner IO pad into the second access region, and a second leg perpendicular to the first leg that extends into the die interior.

4. The IC die of claim 1, wherein the first corner IO pad is a power pad.

5. The IC die of claim 1, wherein the first pad region of the first adjacent side IO pad is shorter than a corresponding pad region of at least one other side IO pad in the first set of side IO pads.

6. The IC die of claim 1, wherein:
   each side of the die interior has a set of side IO pads;
   the IC die has four corners, each corner having a corner IO pad;
   each corner IO pad is adjacent to at least one shortened, adjacent side IO pad that defines a corresponding access region; and
   the IC die has a different trace running through each corresponding access region to connect a corresponding corner IO pad to the die interior.

7. The IC die of claim 6, wherein:
each corner IO pad is adjacent to two shortened, adjacent side IO pads that define two corresponding access regions; and
the IC die has a trace running through each corresponding access region to connect the corresponding corner IO pad to the die interior.

8. The IC die of claim 7, wherein:
each trace lies in a top metal layer of the IC die;
each corner IO pad is a power pad; and
a pad region of each adjacent side IO pad is shorter than a corresponding pad region of one or more other side IO pads in each set of side IO pads.

9. A packaged semiconductor device comprising the IC die of claim 1.

10. The IC die of claim 1, wherein the IO pads of the first set all have the same length except for the first adjacent side IO pad, which has a shorter length.

11. An integrated circuit (IC) die, comprising:
a die interior having four sides;
a first set of side input/output (IO) pads located along a first side of the die interior;
a second set of side IO pads located along a second side of the die interior adjacent to the first side at a first die corner of the IC die, wherein the first die corner has lateral dimensions;
a first corner IO pad located within the first die corner, wherein a first adjacent side IO pad in the first set of side IO pads is adjacent to the first corner IO pad and has a first pad region that is shorter than the corresponding lateral dimension of the first die corner, thereby defining a first access region; and
a first trace running through the first access region to connect the first corner IO pad to the die interior, wherein the first trace has a first leg that projects perpendicular from the first corner IO pad into the first access region, and a second leg perpendicular to the first leg that extends into the die interior,
wherein the first pad region, the first access region, and the first trace are in a top metal layer (TML) of the IC die, and
the first pad region is a TML passivation region of the first adjacent side IO pad.

* * * * *